(12) United States Patent
Owen

(10) Patent No.: US 7,113,017 B2
(45) Date of Patent: Sep. 26, 2006

(54) FLOATING GATE ANALOG VOLTAGE LEVEL SHIFT CIRCUIT AND METHOD FOR PRODUCING A VOLTAGE REFERENCE THAT OPERATES ON A LOW SUPPLY VOLTAGE

(75) Inventor: William H. Owen, Los Altos Hills, CA (US)

(73) Assignee: Intersil Americas Inc., Milpitas, CA (US)

(*) Notice: Subject to any disclaimer, the term of this patent is extended or adjusted under 35 U.S.C. 154(b) by 0 days.

(21) Appl. No.: 10/884,234

(22) Filed: Jul. 1, 2004

(65) Prior Publication Data
US 2006/0001470 A1    Jan. 5, 2006

Related U.S. Application Data

(63) Continuation-in-part of application No. 10/884,234, filed on Jul. 1, 2004.

(51) Int. Cl.
H03L 5/00    (2006.01)
(52) U.S. Cl. .................................. 327/333
(58) Field of Classification Search ........... 365/185.01, 365/185.02, 185.23; 327/333
See application file for complete search history.

(56) References Cited

U.S. PATENT DOCUMENTS

| | | | |
|---|---|---|---|
| 3,750,115 A * | 7/1973 | Mundy | 365/185.08 |
| 4,752,912 A | 6/1988 | Guterman | |
| 4,935,702 A | 6/1990 | Mead et al. | |
| 4,953,928 A | 9/1990 | Anderson et al. | |
| 4,980,859 A | 12/1990 | Guterman et al. | |
| 5,059,920 A | 10/1991 | Anderson et al. | |
| 5,095,284 A | 3/1992 | Mead | |
| 5,166,562 A | 11/1992 | Allen et al. | |
| 5,875,126 A | 2/1999 | Minch et al. | |
| 5,903,487 A | 5/1999 | Wu et al. | |
| 5,986,927 A | 11/1999 | Minch et al. | |
| 6,297,689 B1 | 10/2001 | Merrill | |
| 6,396,739 B1 * | 5/2002 | Briner | 365/185.2 |
| 6,515,903 B1 | 2/2003 | Lee et al. | |

* cited by examiner

Primary Examiner—My-Trang Nuton
(74) Attorney, Agent, or Firm—Nixon Peabody LLP

(57) ABSTRACT

A floating gate voltage level shift circuit is disclosed for generating a voltage reference which can operate on a low supply voltage Vcc by providing a circuit that enables the floating gate to be set accurately to a positive voltage during a SET operation and subsequently shifted down to a lower voltage for a READ operation. The floating gate voltage level shift circuit comprises a differential amplifier with two floating gates, a first floating gate and a second floating gate where the second floating gate is capacitively coupled to either a READ voltage or a Vshift voltage. The floating gate voltage level shift circuit operates in two primary modes, a SET operation and a READ operation. During the SET operation, the C1p capacitor of the second floating gate is connected to a Vshift voltage, rather than ground, while accurately setting the floating gate a positive voltage. The output of the differential amplifier typically swings a volt or more above and below the voltage of the second floating gate while settling to a desired voltage. During the READ operation, the C1p capacitor of the second floating gate is connected to ground, thereby causing the floating gate to shift down to a lower voltage which enables the voltage reference to work on low supply voltage.

14 Claims, 9 Drawing Sheets

FLOATING GATE ANALOG VOLTAGE LEVEL SHIFT CIRCUIT AND METHOD FOR PRODUCING A VOLTAGE REFERENCE THAT OPERATES ON A LOW SUPPLY VOLTAGE

CROSS REFERENCE TO RELATED APPLICATIONS

This application is a continuation-in-part of prior application Ser. No. 10/338,189, filed Jan. 7, 2003, now U.S. Pat. No. 6,898,123, issued May 24, 2005, which is incorporated by reference herein.

BACKGROUND OF THE INVENTION

1. Field of Invention

This invention relates generally to electronics, and more particularly to a programmable floating gate circuit for generating a voltage reference.

2. Description of Related Art

Programmable analog floating gate circuits have been used since the early 1980's in applications that only require moderate absolute voltage accuracy over time, e.g., an absolute voltage accuracy of 100–200 mV over time. Such devices are conventionally used to provide long-term nonvolatile storage of charge on a floating gate. A floating gate is an island of conductive material that is electrically isolated from a substrate but capacitively coupled to the substrate. Typically, a floating gate forms the gate of an MOS (metal-oxide semiconductor) transistor that is used to read the level of charge on the floating gate without causing any leakage of charge therefrom.

Various means are known in the art for introducing charge onto a floating gate and for removing the charge from the floating gate. Once the floating gate has been programmed at a particular charge level, it remains at that level essentially permanently, because the floating gate is surrounded by an insulating material which acts as a barrier to discharging of the floating gate. Charge is typically coupled to the floating gate using hot electron injection or electron tunneling. Charge is typically removed from the floating gate by exposure to radiation (UV light, x-rays), avalanched injection, or Fowler-Nordheim electron tunneling. The use of electrons emitted from a cold conductor was first described in an article entitled *Electron Emission in Intense Electric Fields* by R. H. Fowler and Dr. L. Nordheim, Royal Soc. Proc., A, Vol. 119 (1928). Use of this phenomenon in electron tunneling through an oxide layer is described in an article entitled *Fowler-Nordheim Tunneling into Thermally Grown SiO$_2$* by M. Lenzlinger and E. H. Snow, Journal of Applied Physics, Vol. 40, No. 1 (January, 1969), both of which are incorporated herein by reference. Such analog floating gate circuits have been used, for instance, in digital nonvolatile memory devices and in analog nonvolatile circuits including voltage reference, Vcc sense, and power-on reset circuits.

The output voltage, Vo, of a floating gate analog voltage (FGA) reference can typically be set to any level between 0 and about 8V DC. For example, a FGA reference can be set accurately to Vo=100 mV if desired. However, in order for the reference to work properly on a very low supply voltage Vcc, such as 1V, the internal MOS gate voltages need to be less than ~1V, such that the MOS transistors are enabled to operate in the high gain, low current prethreshold region. Devices that can be constructed using a thick oxide floating gate EEPROM (electrical-erasable programmable read-only memory) process limit how large a negative voltage can be generated on a chip, which makes it difficult to set the voltage on a floating gate negative or close to 0V directly during a set operation using the dual conduction electron tunneling FGA reference set operation, as described in patent application Ser. No. 10/338,189. Consequently, shifting the voltage level of a floating gate down after a set operation can be used to enable the floating gate to be accurately set to a more positive voltage during a set operation, and then shifted down to a lower voltage for read operations with a low supply voltage Vcc.

Floating gate level shifting is a well-known technique for programming and erasing EEPROM memory cells. A direct write EEPROM memory cell uses a coupling capacitor between the bit line and the floating gate as well as the poly2-poly1 capacitance between the word line and the floating gate to couple the floating gate negative after programming the cell. See, for example, U.S. Pat. No. 4,752,912. When a direct write EEPROM cell is programmed, the bit line is taken to about 14V, the word line is taken to +20V, the poly1 deselect line is taken to −3V, and the floating gate is set to approximately +8.5V. After programming, the floating gate is capacitively coupled down by about 70% of the 14V on the bit line (−9.8V) and by about 10% of the 20V on the word line (−2V) and coupled up by about 10% of the 7V difference on the deselect line (+0.7), such that the floating gate ends up with a voltage level of about −3.5V. This turns off the floating gate transistor by several volts to assure that no current flows in programmed EEPROM cells during a read operation. Several volts of negative programmed floating gate margin help assure that all of the programmed cells are off even with cell to cell variations and after many write cycles.

Various floating gate level shift circuits have been proposed to allow digital and analog circuits to operate at low Vcc by shifting the equivalent input transistor threshold lower during operation. In one solution, the floating gate level shift circuit has a floating gate with 2 coupling capacitor inputs. The charge level on the floating gate is initially set to 0 using UV exposure. Then, a positive Vbias is applied to the second capacitor input to the floating gate. The positive Vbias raises the voltage on the floating gate transistor close to Vt (threshold voltage), which reduces the DC voltage needed on the first coupling capacitor to turn on the transistor. This effectively "reduces the Vt" of the floating gate transistor as seen by the first coupling capacitor, which allows the circuit to work with lower input and supply voltages.

In another solution, floating gate MOS devices called FGUVMOS devices (floating gate ultraviolet metal oxide semiconductor), the floating gates are set by exposing the circuit to UV light, with ~Vcc/2 applied to all the signal inputs. Once set in this manner, FGUVMOS devices have low "effective Vt" and can be operated at very low supply voltages. However, FGUVMOS devices require a very long (many minutes) UV exposure time to set each product, which is not practical for manufacturing accurate voltage references and comparators that operate on low Vcc.

Accordingly, it is desirable to provide a floating gate level shift circuit and method that generates a highly accurate voltage reference which can operate on a low supply voltage.

SUMMARY OF THE INVENTION

The present invention describes a floating gate voltage level shift circuit for generating a voltage reference which can operate on low Vcc by providing a circuit that enables the floating gate to be set accurately to a higher positive voltage during a SET operation and subsequently shifted down to a lower voltage for a READ operation using a low Vcc. The floating gate voltage level shift circuit comprises a differential amplifier (or differential stage) with two floating gates, a first floating gate (fgr) and a second floating gate (fg1) where the second floating gate is capacitively coupled to either a READ voltage or a Vshift voltage. The floating gate voltage level shift circuit operates in two primary states, a SET operation and a READ operation. During the SET operation, the C1p capacitor of the second floating gate is connected to a positive Vshift voltage, rather than ground, while the floating gate is accurately set to a positive voltage. The output of the differential amplifier typically swings a volt or more above and below the voltage of the second floating gate (Vfg1) while settling to a desired voltage. During the READ operation, the C1p capacitor of the second floating gate is connected to ground, thereby shifting the voltage on fg1 down to a lower voltage.

In one embodiment, the floating gate voltage level shift circuit produces a voltage reference that can operate on low Vcc by connecting a voltage shift capacitor (C1p) to a voltage Vshift during a SET operation and connecting C1p to ground during a READ operation to thereby cause the voltage at the second floating gate, Vfg1, to shift down. In an alternative embodiment, the floating gate voltage level shift circuit produces a voltage reference that can operate on low Vcc by connecting both capacitors (C1 and C1p) to the Vshift voltage during a SET operation and thereafter connecting both capacitors to ground to cause the voltage on the second floating gate to shift down during a READ operation.

Broadly stated, the floating gate voltage level shift circuit, comprises a first floating gate for storing charge; a second floating gate for storing charge; a voltage shift capacitor having a first terminal coupled to the second floating gate and a second terminal; and a differential amplifier, coupled between the first floating gate and the second floating gate, for causing the charge level on the first floating gate to be modified during a SET operation as a function of the voltage on the second floating gate; wherein, during the SET operation, the voltage shift capacitor is coupled to a first predetermined voltage; wherein, during a READ operation, the second terminal of the voltage shift capacitor is coupled to a second predetermined voltage.

Other structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

Reference symbols or names are used in the Figures to indicate certain components, aspects or features therein, with reference symbols common to more than one Figure indicating like components, aspects of features shown therein.

DETAILED DESCRIPTION OF THE PREFERRED EMBODIMENTS

Figure 1:
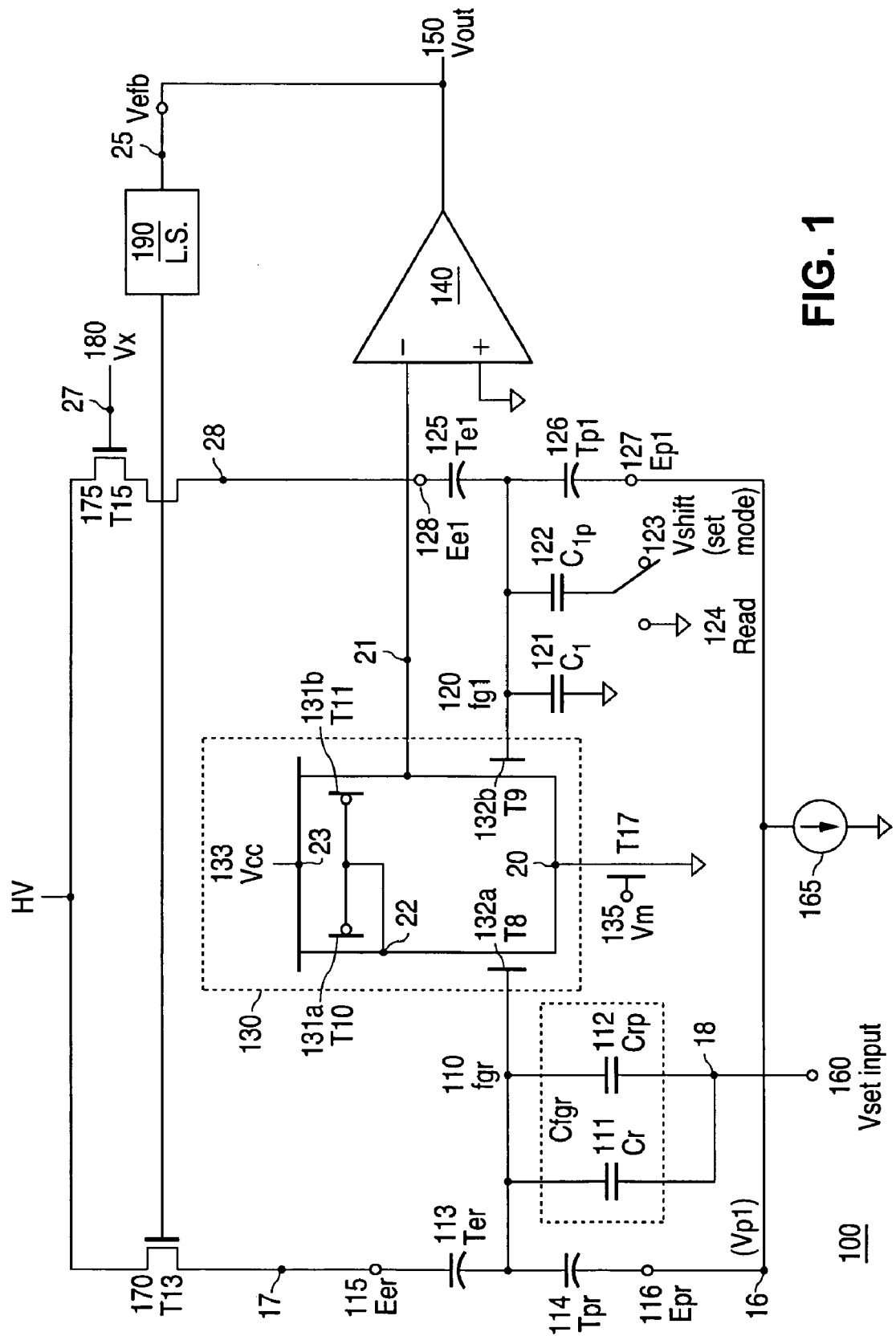
FIG. 1 is a simplified schematic diagram in a SET mode illustrating a first embodiment of a floating gate voltage level shift circuit having a differential amplifier with two floating gate inputs for generating a voltage reference in accordance with the present invention.

Referring now to FIG. 1, there is shown a simplified schematic diagram in a SET mode illustrating a first embodiment of a floating gate voltage level shift circuit having a differential amplifier with two floating gate inputs, a first floating gate input fgr 110 and a second floating gate input fg1 120, for generating a voltage reference. Initially, the floating gate voltage shift circuit 100 is used to accurately set a floating gate to an analog voltage reference during a high voltage SET mode. Subsequently, after the analog voltage reference is set, the floating gate voltage level shift circuit 100 shifts down the analog voltage reference during a READ mode in which the floating gate voltage level shift circuit 100 is configured as a precise voltage comparator circuit with a built-in voltage reference or a precise voltage reference circuit. The differential amplifier 130 comprises a set of enhancement mode transistors, a first transistor T10 131a, a second transistor T11 131b, a third transistor T8 132a, and a fourth transistor T9 132b. In addition, the differential amplifier 130 is further coupled to the Vcc 133, a current source transistor T17 136 with the gate of T17 connected to a mirror voltage Vm 135, and an amplifier 140 for generating a Vout signal 150.

The transistors T8 132a and T9 132b are preferably NMOS transistors that are reasonably well matched by layout, and the transistors T10 131a and T11 131b are preferably PMOS transistors that are reasonably well matched by layout. The sources of NMOS transistors T8 132a and T9 132b are coupled together at a node 20. The drain of NMOS transistor T8 132a is coupled to a node 22, and its gate is floating gate fgr 110. The drain of NMOS transistor T9 132b is coupled to a node 21, and its gate is floating gate fg1 120. The PMOS transistor T10 131a is coupled common drain, common gate, to node 22, with its source coupled to a node 23. The gate of PMOS transistor T11 131b is coupled to at node 22. Its drain is coupled to node 21, and its source is coupled to node 23. A voltage supply Vcc 133, typically 3 to 5 volts, is coupled to node 23. A suitable semiconductor fabrication process to manufacture the floating gate voltage shift circuit 100 is a CMOS EEPROM (complementary metal-oxide semiconductor and electrically erasable programmable read only memory) process.

In the level shifted dual floating gate reference, the floating gates are initially set to a higher voltage than desired for low supply voltage read operation. But during the SET operation, a DC bias (i.e., a Vshift 123) is applied to a capacitor coupled to fg1 120. The voltage, Vfg1, on floating gate fg1 120 is then lowered by connecting the coupling capacitor to ground during a READ operation. During a read operation, the differential amplifier settles with Vfgr~Vfg1, which, since Vfg1 is lower, causes Vfgr and consequently Vo to be lower than initially set. In a precision analog voltage reference, it is highly desirable to have the level shift coupling capacitor connected to ground rather than to another supply which would have to be highly accurate and stable so it does not affect the accuracy and stability of the Vout 150. This is different from the prior art where the Vbias is grounded during the programming and a bias voltage is applied during the normal operation of the circuit to reduce the threshold.

The output voltage, Vout 150, of the reference during a READ operation is directly proportional to the difference in charge level on the first floating gate input fgr and the second floating gate input fg1 120. The floating gate, fgr 110, is connected to two capacitors, Cr 111 and Crp 112 located between the floating gate input fgr 110 and a Kelvin Sense 155. The combination of the Cr 111 and Crp 112 capacitors are also referred to as a steering capacitor. The floating gate fg1 120 is connected to two capacitors, C1 121 and C1p 122. In the embodiment, the C1p 122 capacitor is also referred to as a voltage shift capacitor. The capacitors, Cr 111 and C1 121, can be made of N+/gate oxide/poly capacitors. The capacitors, Crp 112 and C1p 122, can be made of poly2/poly oxide/poly1 capacitors. The poly1-N+ gate oxide capacitance per unit area is significantly larger than the poly1-poly2 capacitance per unit because the poly1-poly2 oxide is significantly thicker than the poly1-N+ gate oxide. In an exemplary thick oxide tunneling process, the gate oxide is approximately 250 Å, while the poly1-poly2 oxide is approximately 1250 Å. In this process, the gate oxide capacitance is approximately 1.4 fF/u2, while the poly1-poly2 capacitance is approximately 0.28 fF/u2.

If the floating gate is laid out with the poly 1 covered by poly2 such that the gate oxide area equals the poly1-poly2 area, C1p 122 and Crp 112 is 17% of the total floating gate capacitance. However, a higher percentage of poly1-poly2 capacitance, such as 25%, can be made by laying out additional poly1-poly2 overlap area on field regions instead of on top of poly1 on N+ gate regions.

The floating gate voltage level shift circuit 100 is used to make a voltage reference that can operate on a very low Vcc voltage 133, such as 1V or less. During the programming operation, fg1 120 can be set accurately to a voltage in the 2V to 5V range. During the programming operation, the Vcc 133 is typically in the range of 6 to 8V while the fg1 120 is set in the 2V to 5V range, which allows the differential amplifier output to swing a volt or more above and below Vfg1 while settling to the desired final voltage. If Vfg1 is too low, the amplifier may "bottom out" and not be able to settle to the desired voltage. This is why it is desirable to have SET0=Vfg1>2V in order to allow the differential amplifier adequate voltage margin below Vfg1 to settle properly during the programming operation. In one example, during the read operation the Vfg1 voltage is typically less than 1V for the Vcc 133 to operate in a low voltage.

The minimum supply voltage Vccmin for this differential amplifier is Vds+Vds+Vtp where Vds is the drain saturation voltage for both the N channel floating gate transistors 132A and 132b and current mirror transistor T17 and Vtp is the threshold voltage for the P Channel load transistors 131a and 131b. Using typical values of Vt~0.5V and Vds ~0.2V, Vccmin is 0.9V. However, this minimum operating voltage can only be achieved if Vfg1~Vds+Vtn. Using Vt~0.5V and Vds~0.2V, this means Vfg1 needs to be set to ~0.7 volt to operate at Vccmin=0.9V. For example, if Vfg1 is higher, such as 2V, the voltage on node 21 is 2V-Vtn=1.5V and the minimum supply voltage is 1.5V+Vds+Vtp=2.2V. Vfg1=0.7V during READ can be achieved using this level shift circuit with a C1p coupling ratio of 25% by setting Vfg1=2.7V with Vshift=Vcc=8V. During a SET operation, the C1p capacitor 122 is connected to the Vshift 123 instead of the ground 124. The Vshift 123 is held at 8V during the SET operation. After the SET operation, the C1p capacitor 122 is connected to the ground 124 during the READ operation which capacitively couples Vfg1 down. In this example, Vfg1 is coupled down 25%×8 V=-2V such that Vfg1=0.7V during READ, which allows the differential amplifier 130 to operate on 1V or less during READ.

This allows the floating gate to be set accurately to a higher voltage during a SET operation and then shifted down to a lower voltage such that the amplifier can operate on low Vcc during a READ operation.

Table 1 below shows some exemplary values of the parameters for the SET and READ modes:

TABLE 1

| Parameter | SET Mode | READ Mode |
| --- | --- | --- |
| Vcc | 8 V | 1 V |
| Vfg1 | 2.7 V | 0.7 V |
| Vshift | 8 V | 0 V |

Figure 2:
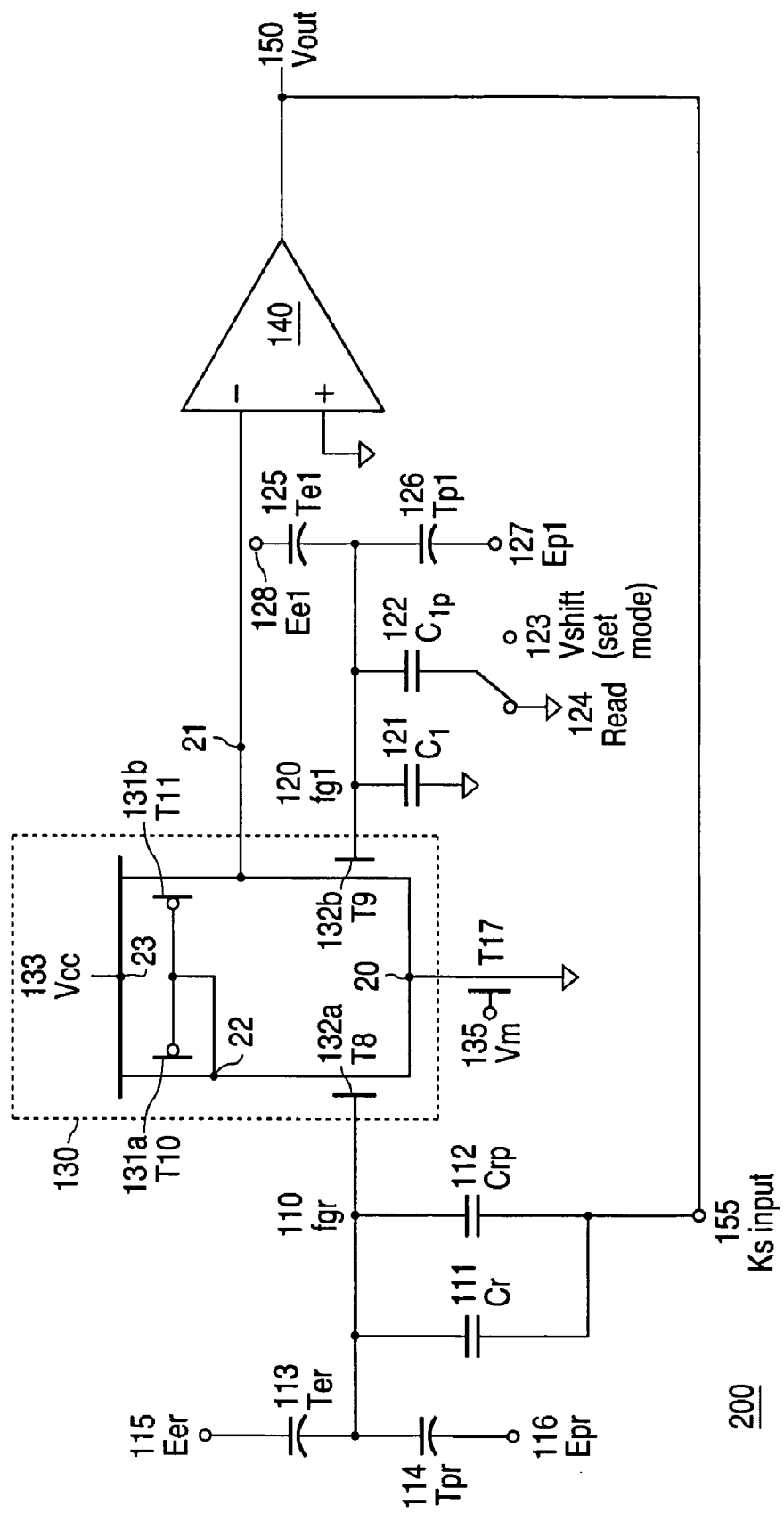
FIG. 2 is a simplified schematic diagram in a READ mode illustrating a first embodiment of a floating gate voltage level shift circuit having a differential amplifier with two floating gate inputs for generating a voltage reference in accordance with the present invention.
Figure 3:
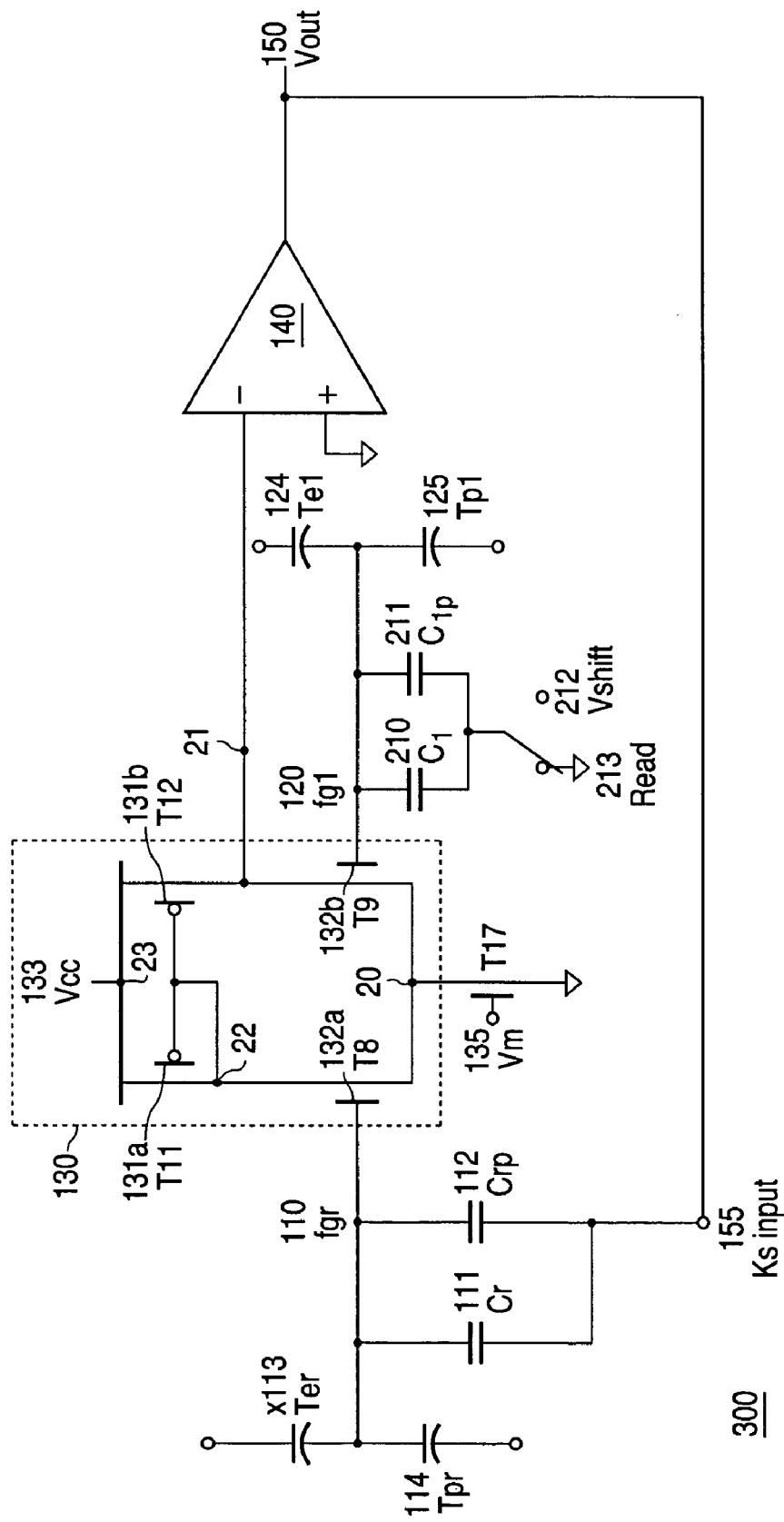
FIG. 3 is a simplified schematic diagram illustrating a second embodiment of a floating gate voltage level shift circuit having a differential amplifier with two floating gates for generating a voltage reference in accordance with the present invention.

The floating gate voltage level shift circuit 100 also comprises a programming tunnel device Tpr 114 formed between the floating gate fgr 110 and a programming electrode Epr 116, at a node 16; an erase tunnel device Ter 113 formed between the floating gate fgr 110 and an erase electrode Eer 115, at a node 17; and a steering capacitor Cfgr coupled between floating gate fgr and a node 18. The steering capacitor Cfgr corresponds to the combination of the Cr 111 and Crp 112 capacitors as shown in FIGS. 1–3. The steering capacitor, Cfgr, coupled to the first floating gate 110, for controlling the charge level on the first floating gate as a function of an input set voltage 160 that is coupled through the steering capacitor, Cfgr, to the first floating gate during a SET mode.

The floating gate voltage level shift circuit 100 further comprises a programming tunnel device Tp1 126 formed between the floating gate fg1 120 and a programming electrode Ep1 127, at node 16, and an erase tunnel device Te1 125 formed between the floating gate fg1 120 and an erase electrode Ee1 128, at node 28. Preferably, the programming electrodes Epr 116 and Ep1 127 receive a negative voltage during the SET mode, and the erase electrodes Eer 115 and Ee1 128 receive a positive voltage during the SET mode. Moreover, the tunnel devices Tpr 114, Tp1 126, Ter 113 and Te1 125 are preferably Fowler-Nordheim tunnel devices that are reasonably well matched as a result of their chip layout.

Tunnel devices Tp1 126 and Te1 125 operate in dual conduction to modify the charge level on the floating gate fg1 120 by allowing electrons to tunnel onto and off of the floating gate fg1 120 so as to divide the voltage between nodes 28 and 16 in half. Dual conduction occurs when tunnel current flows through both tunnel devices, Te1 125 and Tp1 126, which occurs when the voltage differential (Vx−Vp1) is at least two tunnel voltages. Tunnel devices Ter 113 and Tpr 114 operate in dual conduction to modify the charge level on the floating gate fgr 110 by allowing electrons to tunnel onto and off of the floating gate fgr 110 so as to divide the voltage between nodes 17 and 16 in half. Dual conduction occurs when tunnel current flows through both Ter 113 and Tpr 114 which occurs when the voltage differential (Vefb−Vp1) is at least two tunnel voltages. The programming electrodes Epr 116 and Ep1 127 are both connected to node 16 which is connected to a current source 165.

In order to set the voltage on the fg1 120, a voltage Vx 180 is coupled at a node 27 to the gate of a transistor T15 175 in the floating gate voltage level shift circuit 100, such that Vfg1 is set to Vx-1 Vt-1 TV, where 1 Vt is the threshold voltage of the transistor T15 175 and 1 TV is the tunnel voltage of an erase tunnel device Te1 125.

During the SET mode, the feedback path is provided by a level shift 190, a transistor T13 170, and a tunnel device Ter 113. When the Vout 150 goes high, the negative feedback path pulls Vfgr higher. As Vfgr rises, the current in the transistor 132a (T8) increases until it matches the current in the transistor 132b (T9). At this point the differential circuit 130 settles at the point where the currents in transistors T8 132a, T9 132b, T10 131a and T11 131b match and Vfgr=Vfg1.

A simplified schematic diagram in a READ mode is shown in FIG. 2 that illustrates a first embodiment of the floating gate voltage level shift circuit 100 having the differential amplifier 130 with two floating gate inputs, the first floating gate input fgr 110 and the second floating gate input fg1 120. The capacitor C1p 122 is connected to the ground 124 during the READ operation in which the process is described below with respect to FIGS. 4A–B.

In FIG. 3, there is shown a schematic diagram illustrating a second embodiment of a floating gate voltage level shift circuit 200 comprising a voltage reference circuit implemented with the differential amplifier 130 having two floating gate inputs, the fgr 110 and the fg1 120. In this embodiment, capacitors C1 210 and C1p 211 are both connected to the Vshift 212 during a SET operation. In this embodiment, the parallel combination of the C1 210 and C1p 211 capacitors are also referred to as a voltage shift capacitor. The capacitors C1 210 and C1p 211 are subsequently connected to ground 213 or a low voltage potential in order to shift down the Vfg1 voltage during a READ operation. In this case, the coupling from the Vshift 212 to the fg1 120 is nearly 100% so the shift down would be nearly equal to the Vshift 212. For example, if Vshift=2V and Vfg1 is set to 2.7V during a SET operation, then Vfg1 would be about 2.7V−2V=0.7V during the read. The advantage of using C1p with a ratio of 17% to 25% is that the Vshift voltage 212 supply can be 4 to 5 times less accurate to get the same level shift accuracy as a 100% Vshift. Also, it is convenient to connect the Vshift 212 directly to the Vcc 133 during the SET operation so no additional input pins or on-chip voltage reference circuits are needed to achieve an accurate and reproducible level shift.

Figure 4A:
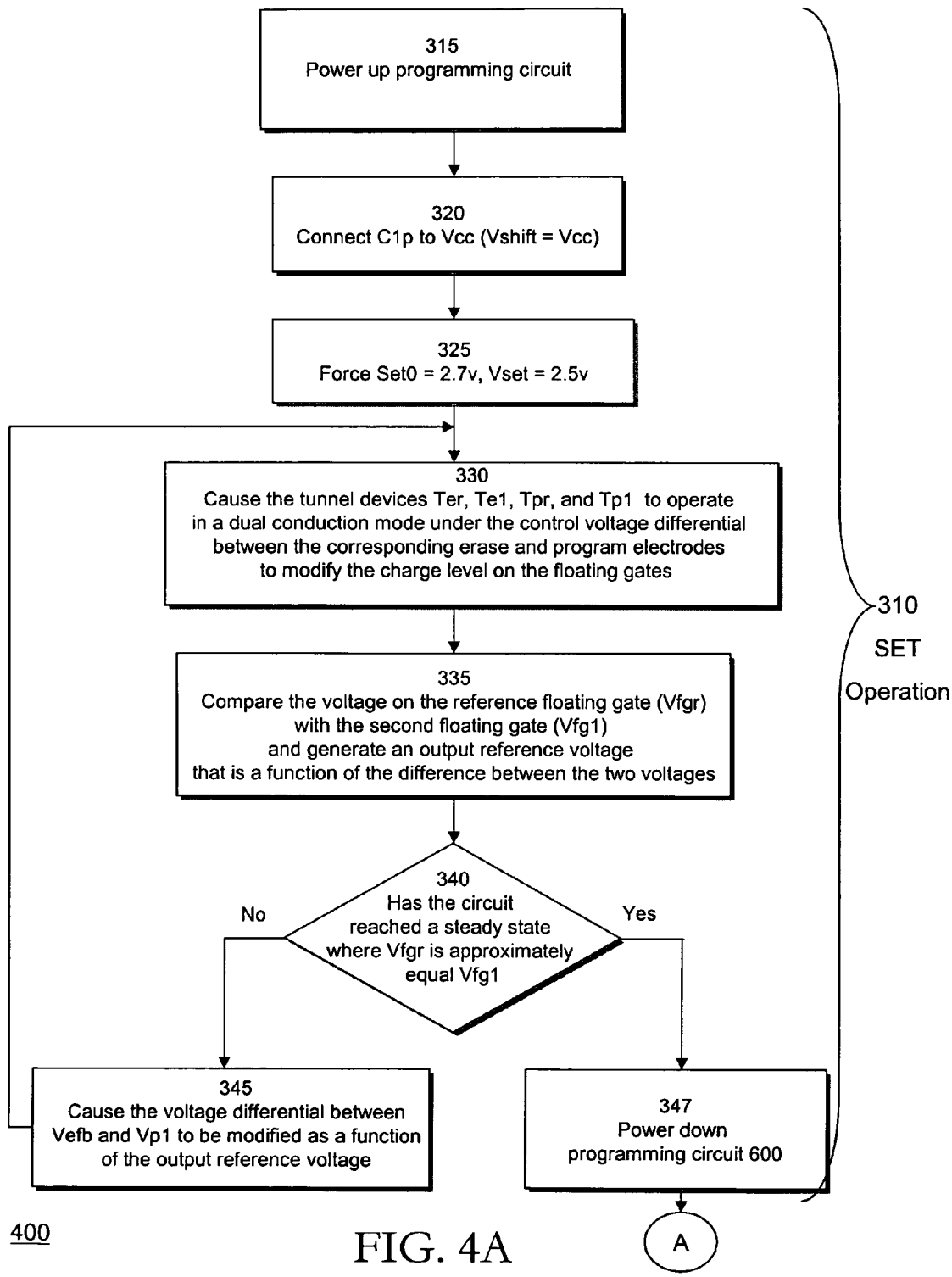
FIGS. 4A–4B are flow diagrams illustrating the process of performing a floating gate voltage level shift in accordance with the present invention.
Figure 5:
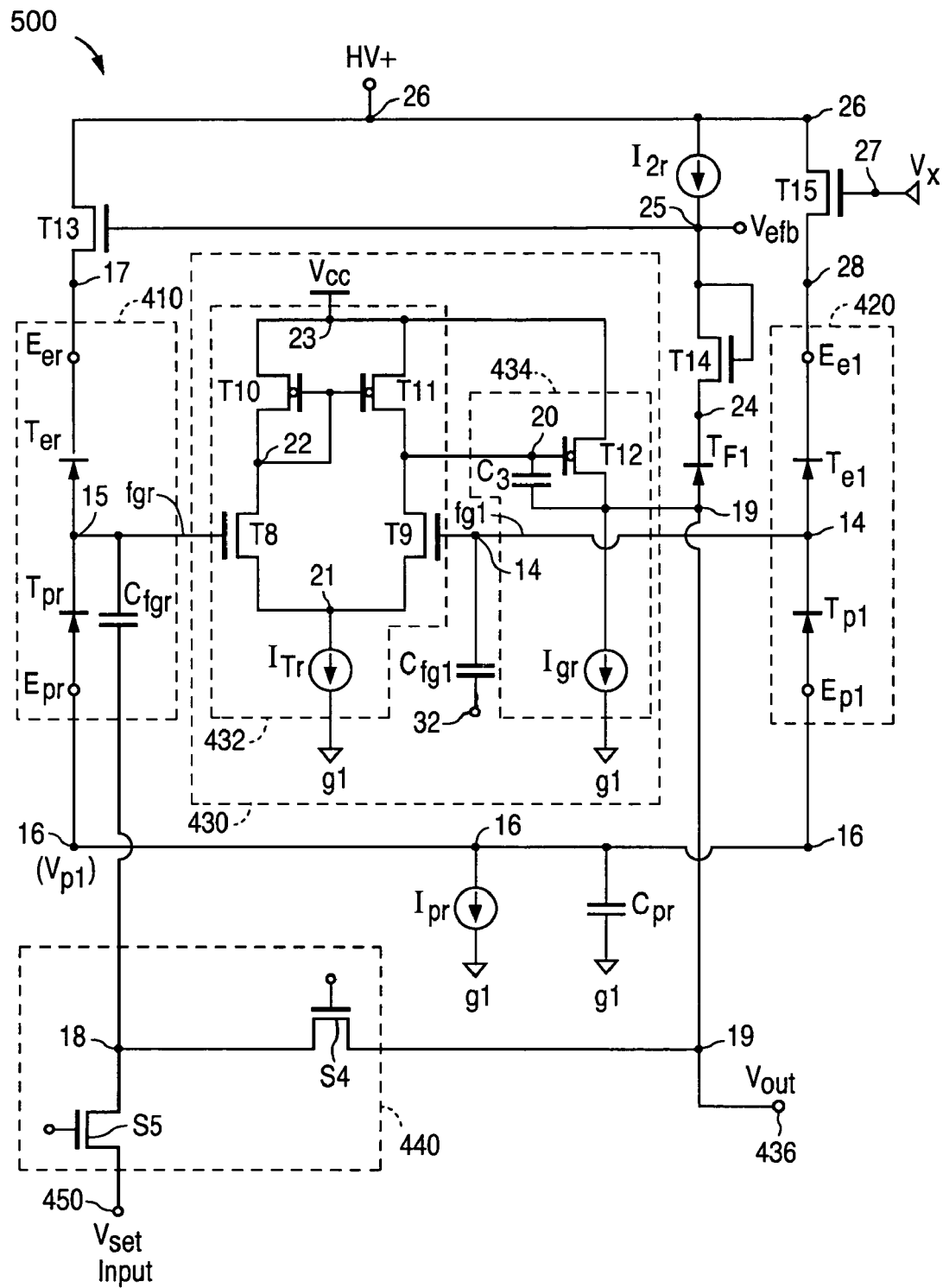
FIG. 5 is a schematic diagram illustrating an exemplary implementation of a differential dual floating gate circuit in accordance with the present invention.

Turning now to FIG. 4A, there is shown a flow diagram 400 illustrating the process steps in setting and reading a floating gate for generating a low reference voltage from a floating gate voltage shift level circuit, e.g. the floating gate voltage level shift circuit 100, 200, or 300. A hardware implementation of the floating gate circuit 100, 200, or 300 and the process 400 is shown in FIG. 5, followed by illustrative timing diagrams in FIGS. 6–8. Although the process 400 is described with respect to the floating gate voltage level shift circuit 100 or the floating gate circuit 500, it is also applicable to either one of the floating gate voltage level shift circuit 100, 200, 300, or 500. The process 400 performs two major operations, a SET operation 310 and a READ operation 350. During the SET operation 310, the capacitor C1p 122 is connected to the Vshift 123 instead of the ground 124. The Vshift 123 is held at a positive voltage during the SET operation 310. After the SET operation 310, the capacitor C1p 122 is connected to the ground 124, which capacitively coupled Vfg1 down. In this example, the delta Vfg1=25%*Vshift. For example, if Vshift=8V and Vfg1=2.7V during the SET operation, then Vfg1=2.7V−(0.25*8V)=2V during the READ operation. This allows the floating gate to be set accurately to a higher voltage during the SET operation 310 and subsequently shifted down to a lower voltage such that the amplifier can operate on a low Vcc voltage.

Figure 6:
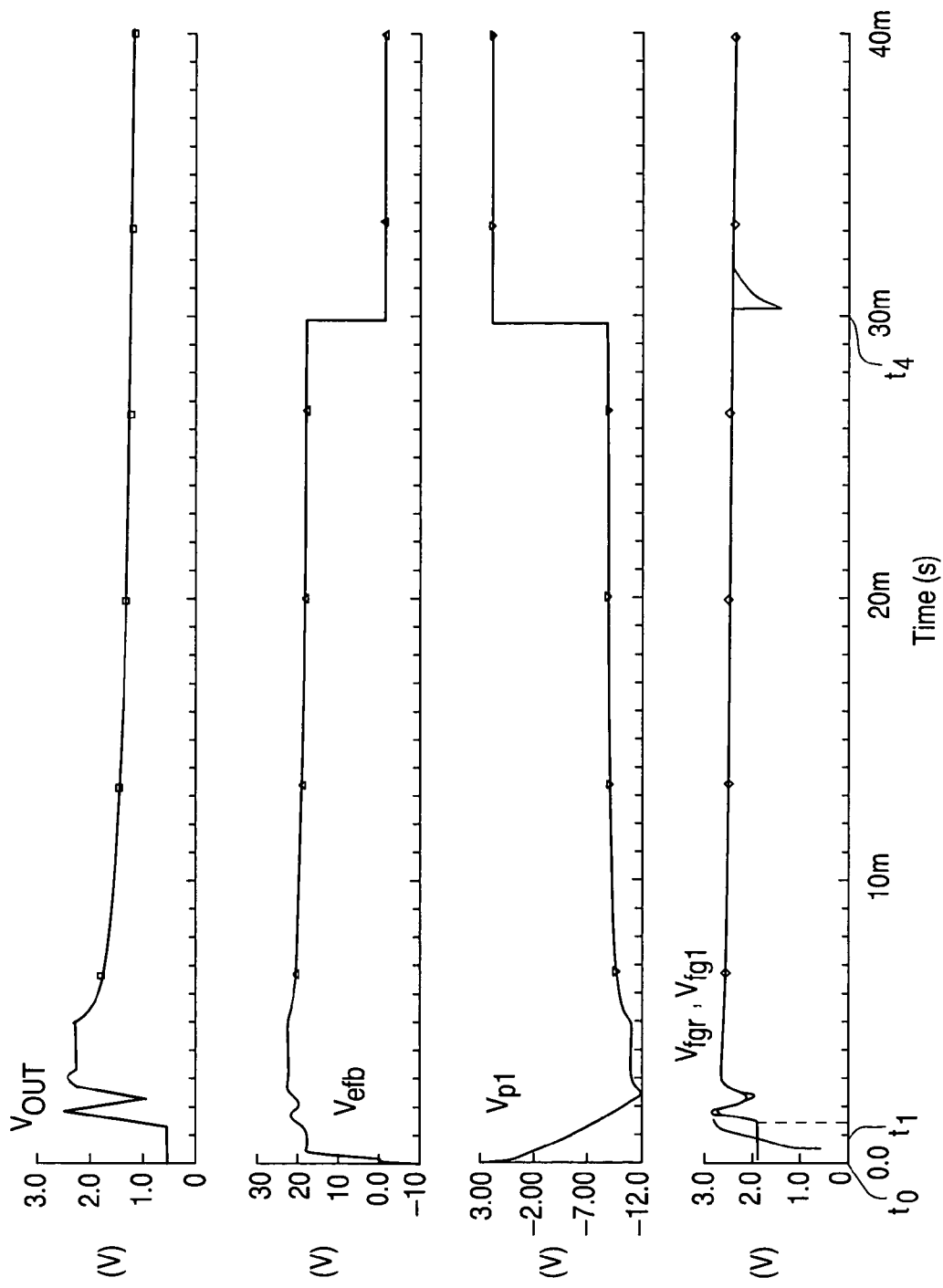
FIG. 6 is a timing diagram illustrating various voltage waveforms vs. time for the method implementation described with respect to FIG. 4.
Figure 7:
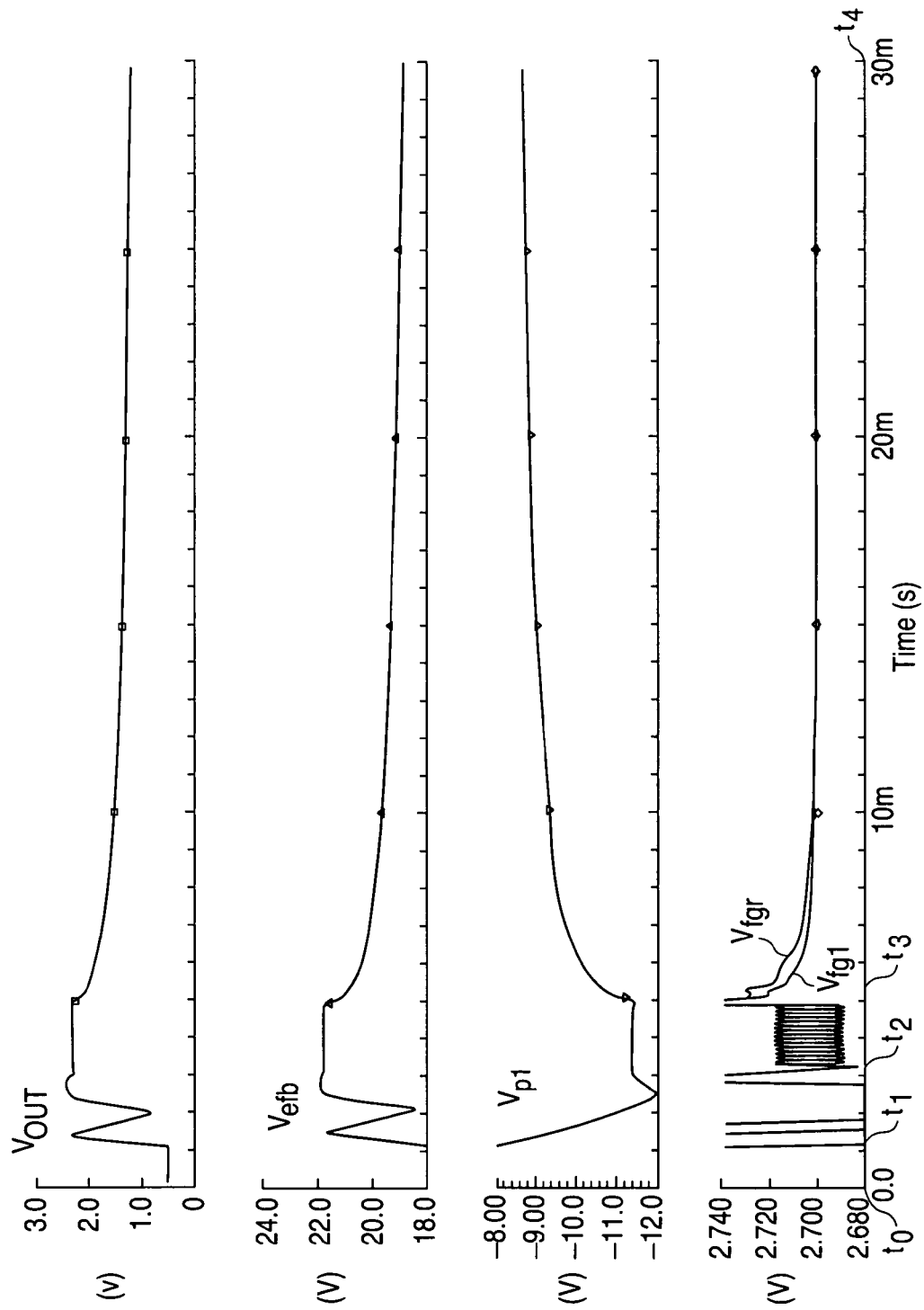
FIG. 7 is a timing diagram illustrating various voltage waveforms vs. time for the method implementation described with respect to FIG. 4.
Figure 8:
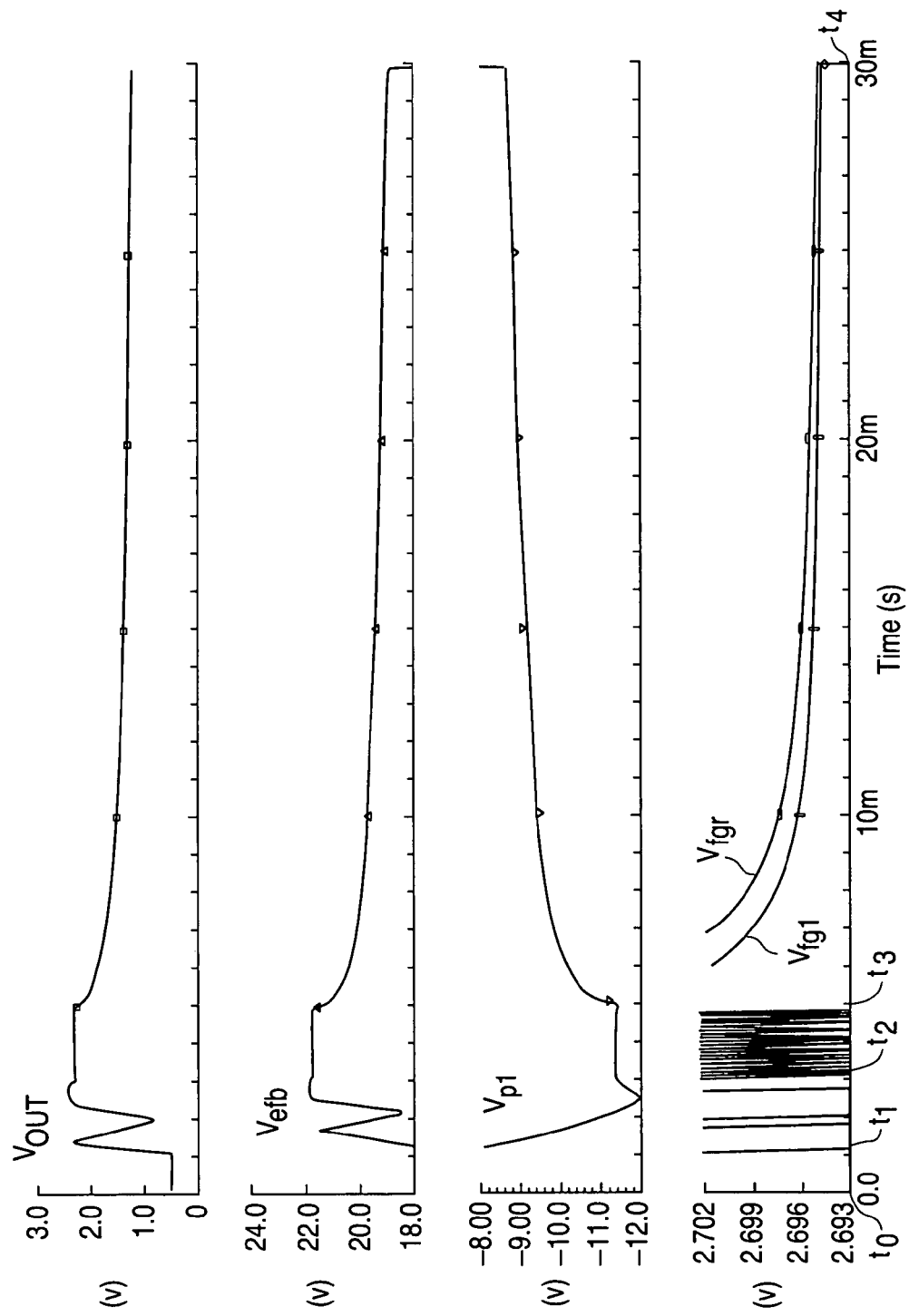
FIG. 8 is a timing diagram illustrating various voltage waveforms vs. time for the method implementation described with respect to FIG. 4.

At step 315, the process 400 powers up the floating gate circuit 500 at the beginning of the SET mode, which is illustrated in FIGS. 6–8 as time to, by setting Vcc equal to Vccset, such as 8V in one example. The floating gate circuit 500 at some point thereafter receives an input set voltage, e.g., VsetØ, and the Vx signal from the floating gate circuit 500 is received at node 27 into the gate of a transistor T15. In addition Vcc is set to +8V, HV+ is ramped up to a high positive voltage of about +22V, which turns on current sources I2 and I2r. Finally, charge pump Ipr is turned on to enable these current sources to begin generating their corresponding currents. Thereafter, according to the preferred implementation of the remaining steps 330–347 of the process, the floating gate circuit 500 can set Vfgr to within about 0.5 mV of Vfg1 in about 30 mSec, as illustrated in FIGS. 6–8.

At step 320, the process 400 connects the C1p capacitor 122 to the Vcc 133 and setting the VShift 123 to the Vcc 133. At step 330, the process 400 sets Set0=2.7V, and Vset=2.5V. At step 335, the floating gate voltage level shift circuit 100 causes tunnel devices Ter 113, Tpr 114, Te1 124 and Tp1 125 or corresponding components in the floating gate circuit 500 to operate in a dual conduction mode under the control of the voltage differential between the corresponding floating gate erase and program electrodes for modifying the charge level on floating gates fgr 110 and fg1 120. Dual conduction occurs when tunnel current flows through both Ter 113 and Tpr 114 or Te1 124 and Tp1 125. Tunnel current flows through both Ter 113 and Tpr 114 when the voltage differential (Vefb−Vp1) is at least two tunnel voltages or approximately 22V, and tunnel current flows through Te1 124 and Tp1 125 when the voltage differential (Vx−Vp1) is at least two tunnel voltages.

At step 340, the process 400 in the floating gate circuit 100 compares Vfgr 110 with Vfg1 120 and generates an output voltage Vout 150 that is a function of the difference between Vfgr 110 and Vfg1 120. The process 400 determines whether the floating gate voltage level shift circuit 100 has settled to a steady state condition, where the Vfgr 110 is approximately equal to the Vfg1 120. If the result is that the floating gate voltage level shift circuit 100 has not reached a steady state, the floating gate circuit 100 causes the voltage differential between Vefb and Vp1 to be modified as a function of the Vout 150, and the floating gate circuit 100 repeats steps 330 through 345 until the floating gate circuit 100 settles to a steady state condition where the Vfgr 110 is approximately equal to the Vfg1 120. When the floating gate voltage level shift circuit 100 has reached a steady state, at step 347, the floating gate voltage level shift circuit 100 is powered down. As a result of process 400, the floating gates fgr 110 and fg1 120 are each set to a charge level that will remain essentially the same over time.

Figure 4B:
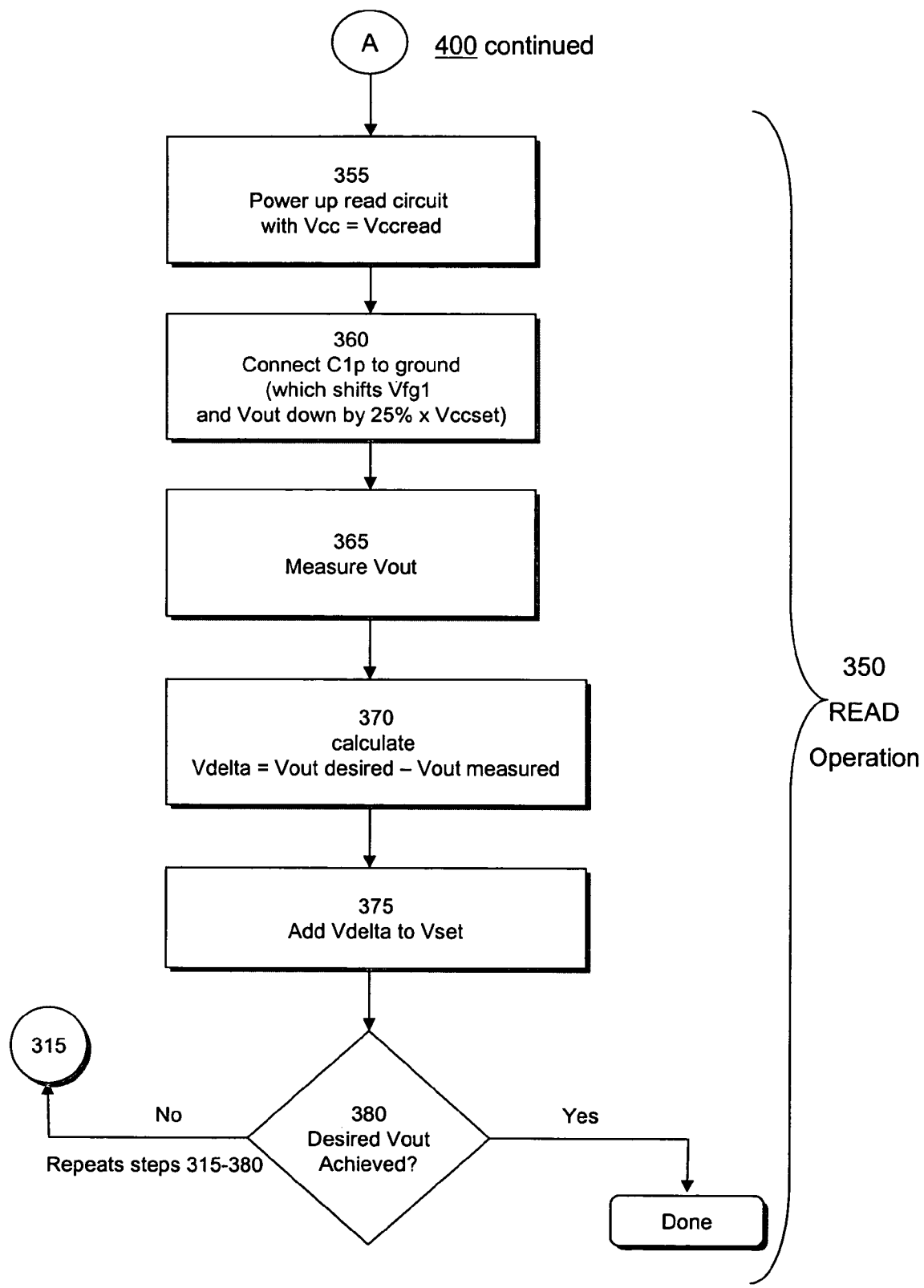

In the READ operation 350 as described in FIG. 4B, at step 355, the process 400 powers up a read circuit in the floating gate voltage level shift circuit and sets Vcc=Vccread. At step 360, the process 400 connects the C1p 122 to the ground 124, which shifts the Vfg1 voltage 120 and the Vout voltage 150 down by 25%×Vccset. A measurement is taken at step 365 of the Vout voltage 150, which should be a number that is very close to 0.500V due to the 2V shift in this example. At step 370, the process 400 computes the value of Vdelta as by subtracting the Vout (measured) from Vout(desired), represented mathematically as Vdelta=Vout(desired)−Vout(measured). At step 375, the process adds the Vdelta computed in step 370 to the value of Vset. If the desired Vout value has not been achieved in step 380, the process 400 returns to the step 315 in the SET operation 310 with the new Vset voltage and repeats steps 315 through 380 until the desired Vout accuracy has been obtained.

The parameter, Vdelta, is a measure of the accuracy of Vout and is selected depending on the Vo accuracy tolerance permitted for a particular application. For example, the desired Vout could be selected at 0.5000V, with a +/−0.0001 V tolerance level for Vdelta.

Preferably, the floating gate circuit 500 causes dual conduction in the following manner. Current source I2r is turned on and starts to pull up Vefb (node 25) respectively. For example, Vefb ramps up to about 18V in less than 0.5 mSec. The negative current source Ipr is turned on and pulls Vp1 (node 16) negative. Respectively, in this instance, charge pump Ipr gradually ramps Vp1 down to about −11V voltage in about 2 mSec. Current source Ipr controls the tunnel current that flows through tunneling devices Ter, Tpr, Te1 and Tp1 in floating gate circuit 500.

The floating gate circuit 500 receives a Vx signal (node 27), which is a high voltage DC signal generated by another circuit that tracks the circuit 500 such that fg1 is set to a predetermined voltage. A suitable example of such circuit for generating the Vx signal is described in a commonly assigned application, Ser. No. 10/338,189. The signal Vx turns on transistor T15, which pulls up Ve1 (node 28) to one Vt below Vx. When Vp1 ramps down to the point where the difference between Vp1 and Ve1 is 2 tunnel voltages, tunnel current flows through tunneling devices Te1 and Tp1. Once tunnel current is flowing in Te1 and Tp1, the voltage on floating gate fg1 (node 14) is equal to Vx−Vt−1 TV, where 1Vt is the threshold voltage at transistor T15 and 1 TV is the tunnel voltage across tunnel device Te1. The voltage on the floating gate fg1 is controlled directly by Vx.

The floating gate circuit 500 produces a Vefb signal controlled by feedback from circuit 430. Vefb (node 25) turns on transistor T13, which pulls up Ver (node 17) to one Vt below Vefb. When Vp1 (node 16) ramps down to the point where the difference between Vp1 and Ver is 2 tunnel voltages, tunnel current flows through tunneling devices Ter and Tpr, and the voltage on fgr (node 15) is controlled directly by Vefb. I2r continues to pull up Vefb until Vefb reaches Vout+1 TV+1 Vt, where 1 TV is the tunnel voltage across tunnel device TF1 and 1Vt is the threshold voltage of transistor T14. When at least one tunnel voltage exists across TF1, tunnel current flows through TF1, and TF1 and transistor T14 act as level shift devices such that Vefb is controlled directly by Vout (node 19).

The voltage waveforms of FIGS. 6–8 illustrate how circuit 500 functions during steps 330 through 347. Dual conduction of tunnel devices Te1 and Tp1 occurs after about 0.5 mSec, as best seen in FIG. 6. Prior to this time, Vfg1 is 0V. However, once tunnel current is flowing through tunnel devices Te1 and Tp1, Vfg1 is controlled by Vx. Dual conduction of tunnel devices Ter and Tpr, on the other hand, occurs slightly later at about 1.5 mSec, which is illustrated as $t_1$ in FIGS. 6–8. Prior to time $t_1$ Vout=ØV, Vefb is pulled-up by I2r and is ramping toward about 18V, and Vfgr is not controlled by Vefb. Once tunnel current is flowing through tunnel devices Ter, Tpr, and TF1 at time $t_1$: the feedback circuit 430 senses that Vfgr is not equal to Vfg1; Vout is a function of the difference between Vfgr and Vfg1; Vefb follows Vout; and Vfgr follows Vefb. For about the next 2.0 mSec which is illustrated as time $t_1$ to time $t_2$ in FIGS. 7 and 8, Vfgr oscillates as Vefb moves up and down as a function of the negative feedback loop. Thereafter, the negative feedback loop causes the differential and gain stages 432 and 434, respectively, to settle to a steady state condition, where circuit 430 ceases to oscillate except for about 30 mV of noise coupled to circuit 430 from the charge pump Ipr as best shown in FIGS. 7 and 8 beginning at time $t_2$.

Beginning at time $t_1$, current source Igr in the gain stage 434 produces a current that is much larger than that generated by current source I2r. Therefore, the gain stage 434 is able to control Vout by sinking all the current from current source I2r that flows through T14 and TF1 to Vout. In addition, the compensation capacitor C3 in the gain stage 434 is made large enough to assure that the feedback loop is stable and settles in less than about 1 mSec. The level shift in Vefb caused by the Vt across transistor T14 approximately matches the voltage drop in T13. The level shift in Vefb caused by the tunnel voltage across tunnel device TF1 approximately matches the voltage drop across tunnel device Ter, so that when the differential and gain stages settle, Vfgr and Vfg1 are about the same. This can be seen in FIG. 8 where Vfgr, Vfg1, and Vout settle, beginning at time $t_2$, except for about 30 mV of noise coupled to floating gates fgr and fg1 from current source Ipr.

Referring again to FIG. 5, once the floating gate circuit 500 settles at step 340 such that Vfgr is approximately equal to Vfg1, the floating gate circuit 500 is powered down at step 347. Powering down the floating gate circuit 500 ramps down the voltages at the erase and programming electrodes toward ground, as seen beginning at time $t_3$ in FIGS. 7 and 8. Step 347 may be performed by simply concurrently shutting off all of the current and voltage sources in the floating gate circuits 500 at time $t_3$. However, this may significantly impact Vfgr once Vefb and Vp1 have ramped back to ØV. As explained above, noise from charge pump Ipr limits the accuracy of setting Vfgr equal to Vfg1 when the negative charge pump that generates Vp1 is ON. This means Vfgr may not be equal to Vfg1 at the beginning of the ramping of Vefb and Vp1 to ground. If Vfgr is not equal to Vfg1 when this ramp down begins, then Vfgr will not equal Vfg1 after Vp1 and Vefb reach ØV. Moreover, during the ramp down, the current that continues to flow through tunnel devices Te1 and Tp1 and through Ter and Tpr is typically not the same. This further affects the final charge level on floating gates fgr and fg1.

To overcome this limitation and thereby maintain the same charge level on floating gates fgr and fg1 during the ramping of Vefb and Vp1 to ground, the current in the erase and program tunnel devices must be the same during this time. In order to maintain the same current in these tunnel devices, the voltage across each of the tunnel devices must be the same, which means Vefb and Vx must ramp down to ØV at the same rate as Vp1 ramps up to ØV. Also the tunnel device characteristics must be reasonably well matched.

The floating gate circuit 500 should be powered down, at step 347, in the following preferred manner. Once the feedback circuit 430 in the floating gate circuit 500 has stabilized for a time and it is clear that further accuracy to setting Vfgr and Vfg1 is limited primarily by the charge pump noise, shown beginning at $t_2$, Ipr is shut off at $t_3$ to eliminate the pump noise. However, HV+, and thereby current source I2r is left on such that the feedback circuit in circuit 500 is still active and continues to control Vx, and the feedback circuit in circuit 500 is still active and continues to control Vefb. At the point when the negative charge pumps are shut off, tunnel current continues to flow through tunnel devices Ter, Te1, Tpr and Tp1 as capacitor Cpr discharges, which pulls up Vp1 back towards ØV. This tunnel current and the capacitance due to Cpr determine the ramp rate on Vp1.

The feedback in the floating gate circuit 500 drives Vefb such that Vfgr to first order tracks, Vfg1. As the floating gate circuit 500 ramps up Vp1, the voltage on floating gate fgr is capacitively coupled upwards. The feedback circuit 430 senses Vfg1 moving upwards and ramps Vefb down toward ØV through the feedback circuit. As Vefb ramps down and Vp1 ramps up toward ØV, the tunnel current in tunnel devices Ter and Tpr decrease rapidly due to the steep slope of their Fowler-Nordheim tunnel device characteristics. Since feedback response time depends directly on the current in the erase tunnel device, the feedback circuit response slows down as Vefb ramps down toward ground. As the tunnel current decreases, both the ramp rate and feedback response times slow down and Vfgr gradually moves closer to Vfg1.

For instance, FIG. 8 shows that Vfgr has converged to within about 0.5 mV of Vfg1 for a set mode time of 30 mSec, and Vfgr may be set even more accurately with respect to Vfg1 by allowing a ramp down time of greater than 30 mV. After Vfgr is allowed to converge on Vfg1 for an amount of time determined by the level of accuracy desired, the HV+ voltage supply, and thereby the I2r current source, can be shut off, for instance at time $t_4$, without affecting the charge on floating gates fgr and fg1. Moreover, Vcc may be shut off.

The response of the feedback circuit should be sufficiently slow to assure that Vfgr is always slightly above Vfg1 so the feedback circuit 430 continues to ramp Vefb down. If Vfgr goes below Vfg1 and the feedback switches the direction Vefb is ramping, the feedback system will start to oscillate very slowly and Vfgr will diverge from Vfg1 instead of converge towards Vfg1. After Vefb and Vp1 have ramped a few volts toward ground and Vfgr is very close to Vfg1, Vefb and Vp1 can be ramped to ØV quickly, as illustrated at time $t_4$ in FIG. 10, by shutting off HV+, because the current in tunnel devices Ter and Tpr is so low it no longer affects the charge on the floating gate fgr. Capacitor Cpr must be carefully set to assure that as Vp1 rises toward ground, the feedback path through the differential stage 432, gain stage 434, TF1 level shift and Ter devices to floating gate fgr is able to ramp down Vefb and move Vfgr closer and closer to Vfg1. If capacitor Cpr is too small, Vp1 rises very quickly, the delay through the feedback path causes Vefb to ramp down too slowly, and Vfgr will rise above Vfg1 instead of converging towards Vfg1. If Cpr is too large, the response of the feedback path is too fast and Vefb is ramped down too much, such that Vfgr may undershoot which causes the circuit to oscillate slowly. If feedback circuit 430 is allowed to oscillate, Vfgr will tend to diverge instead of converge towards Vfg1. Accordingly, Cpr is designed such that the feedback response time is slightly slower than the discharge rate of Cpr. Preferably Cpr should be set at about 2.4 pf.

At the end of the set mode, at time $t_4$, floating gates fgr and fg1 will continue to indefinitely store the charge level programmed on them during the set mode, subject to possible charge loss, e.g., due to detrapping of electrons or dielectric relaxation over time, without any external power being supplied to the floating gate circuit 500. In addition, although in the example illustrated above Vfgr was set to be approximately equal to Vfg1, those of ordinary skill in the art will realize that in another embodiment of the present invention, the floating gate circuit 500 can be configured such that Vfgr is set a voltage that is some other function of Vfg1.

As stated above, once floating gate fgr is set during the SET mode, the floating gate circuit 500 may be configured during a read mode as a voltage reference circuit or as a comparator circuit with a built-in voltage reference. Likewise, once floating gates fg1 and fgr are set during the SET mode, the floating gate circuit 500 may be configured during a read mode as a voltage reference circuit or a comparator circuit with a built-in voltage reference. When the floating gate circuit 500 is configured as a voltage reference, it provides an accurate reference voltage at node 19. This is because when high voltages are ramped down in the floating gate circuit 500, any offsets coupled through the tunnel devices to the corresponding floating gates fgr and fg1 are common mode and do not change the voltage difference between the two floating gates and thus does not change the reference voltage at node 19.

In FIGS. 6–8, there are shown voltage waveforms for Vout, Vp1, Vefb (circuit 500), Vfgr and Vfg1, for the specific implementation of method 340 discussed below relative to those figures. Each of the four waveforms shown in FIGS. 6–8 are the same, only the voltage axes of some of these waveforms are modified to illustrate specific details. Preferably, Vfg1 is set to 2.7V, such that Vfg1=Vfgr=2.7V at the conclusion of the set mode. However, Vfg1 may be set to any voltage in order to set Vfgr during the set mode. In the following example, Vfg1 is set to 2.7V during the set mode. In the circuit implementation illustrated in FIGS. 6–8: Vin=2.50V, Vcc=+8V, HV+ is about 22V, I2r is about 6 nA, Ipr is about 12 nA, Itr is about 5 nA; and Igr is about 20 nA.

A voltage shift capacitor Cfg1 is coupled between floating gate fg1 and a node 32. The voltage shift capacitor Cfg1 corresponds to the C1p capacitor 122 as shown in FIGS. 1–2 for the first embodiment of the floating gate voltage level shift circuit and corresponds to the combination of the C1 capacitor 210 and the C1p capacitor 211 as shown in FIG. 3 for the second embodiment of the floating gate voltage level shift circuit. The bottom plate of voltage shift capacitor Cfg1 is coupled to a predetermined voltage during the set mode. The transistor T15 has its drain coupled to a high voltage supply HV+, at a node 26, its source coupled to node 28, and its gate coupled to Vx node 27.

Setting a voltage on floating gate fgr during the set mode is achieved by taking electrode Epr negative and electrode Eer positive such that the voltage at node 17 minus the voltage at node 16 is two tunnel voltages or approximately 22V. The dual conduction current at 22V is typically approximately one to two nanoamps. An alternative is to create a sufficient voltage differential across electrode Epr and electrode Eer to generate a current flow of approximately 5 nA from node 16 to node 17. In either case, both tunnel devices are conducting, i.e., the tunnel devices are in "dual conduction." By operating in dual conduction, the voltage on the floating gate fgr can stabilize at a DC voltage level for as long a time as needed to enable circuit 500 to end the set mode process in a controlled fashion such that the voltage on floating gate fgr settles to a very precise and accurate level. Operating in dual conduction with feedback through at least one of the tunnel devices is key to making it possible to set the floating gate fgr voltage very accurately.

In dual conduction, the tunnel devices Ter and Tpr, which are reasonably well matched by layout, will modify the charge level on floating gate fgr by allowing electrons to tunnel onto and off of floating gate fgr so as to divide the voltage between nodes 17 and 16 in half. Thus, the floating gate voltage, i.e., the voltage at node 15, will be Vfgr=Vnode 16+(Vnode 17−Vnode 16)/2, which is half way between the voltage at node 17 and the voltage at node 16. Under these conditions, the dual conduction current can typically charge or discharge node 15, which typically has less than 1.0 pF capacitance, in less than 1 mSec. As this occurs, the floating gate voltage "tracks" directly with the voltage at nodes 16 and 17 and settles to a DC voltage that is half way between those two voltages in a few mSec. Accordingly, Vfgr can be set to a positive or negative voltage or 0V depending upon the value of the voltages existing at electrodes Eer and Epr. For example, if the tunnel voltage is approximately 11V for the erase and program tunnel devices Ter and Tpr, and the voltage at electrode Eer is set to about +16V and the voltage at electrode Epr is set to about −6V, then Vfgr will settle at about +5V, which is the midpoint between the two voltages. If the voltage at Eer is set to about +11V and the voltage at Epr is set to about −11 V, then Vfgr will go to about ØV.

As stated earlier, circuit 40 programs both floating gates fgr and fg1 during the set mode. Correspondingly, tunnel devices Tp1 and Te1 similarly operate in dual conduction to modify the charge level on floating gate fg1 by allowing electrons to tunnel onto and off of floating gate fg1 so as to divide the voltage between nodes 28 and 16 in half.

The subcircuit 430 that compares Vfgr, the voltage on floating gate fgr, to Vfg1, the voltage on floating gate fg1 generates an output voltage Vout, at node 19, that is a function of the difference between the voltages on floating gates fgr and fg1. Circuit 430 preferably includes a differential amplifier (or differential stage) 432 that is preferably configured to have a non-inverting input coupled to floating gate fg1 and an inverting input coupled to floating gate fgr. The subcircuit 430 further includes a gain stage 434 with an input coupled to node 20 and an output terminal 436, at node 19. The differential stage 432 compares the voltages received at its inputs and amplifies that difference, typically by a factor of 50 to 100. The gain stage 434 then further amplifies that difference by another factor of 50 to 100. Moreover, at the conclusion of the set mode, Circuit 430 ideally settles to a steady state condition, such that Vfgr=Vfg1.

Those skilled in the art can now appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications, whether explicitly provided for by the specification or implied by the specification, will become apparent to the skilled practitioner upon a study of the drawings, specification, and following claims.

I claim:

1. A floating gate voltage level shift circuit, comprising:
   a first floating gate for storing charge;
   a second floating gate for storing charge;
   a voltage shift capacitor having a first terminal coupled to the second floating gate and a second terminal; and
   a differential amplifier, coupled between the first floating gate and the second floating gate, for causing the charge level on the first floating gate to be modified during a SET operation as a function of the voltage on the second floating gate;
   wherein, during the SET operation, the second terminal of the voltage shift capacitor is coupled to a first predetermined voltage;
   wherein, during a READ operation, the second terminal of the voltage shift capacitor is coupled to a second predetermined voltage.

2. The floating gate voltage level shift circuit of claim 1, wherein the second predetermined voltage comprises ground.

3. The floating gate voltage level shift circuit of claim 1, wherein the second predetermined voltage comprises a reference voltage.

4. The floating gate voltage level shift circuit of claim 1, further comprising a first and second tunnel device coupled to said first floating gate to operate in a dual conduction mode under the control of a voltage differential between a first tunnel electrode coupled to said first tunnel device and a second tunnel electrode coupled to said second tunnel device, for modifying the charge level on said first floating gate during said SET mode.

5. A floating gate voltage level shift circuit, comprising:
   a first floating gate for storing charge;
   a steering capacitor, coupled to the first floating gate, for controlling the charge level on the first floating gate as a function of an input set voltage that is coupled through the steering capacitor to the first floating gate during a SET operation;
   a second floating gate for storing charge;
   a voltage shift capacitor (C1p) having a first terminal coupled to the second floating gate and a second terminal coupled to a first predetermined voltage (Vfirst) during the SET operation and coupled to a second predetermined voltage (Vsecond) during a READ operation; and
   wherein the second predetermined voltage comprises ground.

6. The floating gate voltage level shift circuit of claim 5, wherein, during the READ mode, the voltage shift capacitor is coupled to the second voltage potential such that the voltage on the second floating gate is capacitively shifted down to a lower voltage.

7. The floating gate voltage level shift circuit of claim 5, further comprising a first and second tunnel device coupled to said first floating gate to operate in a dual conduction mode under the control of a voltage differential between a first tunnel electrode coupled to said first tunnel device and a second tunnel electrode coupled to said second tunnel device, for modifying the charge level on said first floating gate during said SET mode.

8. The floating gate voltage level shift circuit of claim 5, further comprising a third capacitor (C1), connected between the second floating gate and ground such that the voltage shift of the second floating gate is proportional to (Vfirst−Vsecond)*{C1p/(C1+C1p)}.

9. A floating gate voltage level shift circuit, comprising:
a first floating gate for storing charge;
a steering capacitor, coupled to the first floating gate, for controlling the charge level on the first floating gate as a function of an input set voltage that is coupled through the steering capacitor to the first floating gate during a SET operation;
a second floating gate for storing charge;
a voltage shift capacitor (C1p) having a first terminal coupled to the second floating gate and a second terminal coupled to a first predetermined voltage (Vfirst) during the SET operation and coupled to a second predetermined voltage (Vsecond) during a READ operation; and
a feedback circuit, coupled between the first floating gate and the second floating gate, for causing the charge level on the first floating gate to be modified during the SET operation until the voltage on the first floating gate is a predetermined function of the voltage on the second floating gate.

10. The floating gate voltage level circuit of claim 9, wherein the feedback circuit comprises:
a differential stage comprising a first, second, third and fourth transistor, each said transistor having a gate and a first and second terminal, wherein said first floating gate is the gate of said first transistor, said second floating gate is the gate of said second transistor, the first terminals of said first and second transistors are coupled together, the second terminals of said first and third transistors are coupled together and are further coupled to the gates of said third and fourth transistors, the second terminals of said second and fourth transistors are coupled together, and the first terminals of said third and fourth transistors are coupled together to a voltage source; and
a gain stage comprising a fifth transistor, having a gate and a first and second terminal, a gain stage current source, and a compensation capacitor, wherein the gate of said fifth transistor is coupled to the second terminals of said second and fourth transistors, the first terminal of said fifth transistor is coupled to the first terminals of said third and fourth transistors, said compensation capacitor is coupled between the gate and the second terminal of said fifth transistor, and the second terminal of said fifth transistor is coupled to said gain stage current source.

11. A method for operating a floating gate voltage level shift circuit having a first floating gate and a second floating gate, comprising:
coupling a first predetermined voltage to the second floating gate during a SET operation;
causing the voltage level on the first floating gate to be modified as a function of the second floating gate during the SET operation;
coupling a second predetermined voltage to the second floating gate during a READ operation such that the voltage level on the second floating gate is modified; and
wherein the second predetermined voltage comprises ground.

12. The method of claim 11, further comprising causing a first and second tunnel device coupled to said first floating gate to operate in a dual conduction mode under the control of a voltage differential between a first tunnel electrode coupled to said first tunnel device and a second tunnel electrode coupled to said second tunnel device, for modifying the charge level on said first floating gate during said SET mode.

13. The method of claim 11, further comprising coupling a Vset voltage to a steering capacitor, wherein the steering capacitor is coupled to said first floating gate.

14. A method for operating a floating gate voltage level shift circuit having a first floating gate and a second floating gate coupled to a differential amplifier, comprising:
coupling a first predetermined voltage to the second floating gate during a SET operation;
causing the voltage level on the first floating gate to be modified as a function of the second floating gate during the SET operation;
coupling a second predetermined voltage to the second floating gate during a READ operation such that the voltage level on the second floating gate is modified;
coupling a Vset voltage to a steering capacitor, wherein the steering capacitor is coupled to said first floating gate; and
measuring a Vdelta voltage which is added to the Vset voltage for one or more iterations of the SET operation to obtain a desired setting accuracy of an output voltage (Vout), wherein the value of Vdelta is equal to Vout (measured) minus Vout(desired).

* * * * *